(12) United States Patent
Wu et al.

(10) Patent No.: US 10,114,077 B2
(45) Date of Patent: *Oct. 30, 2018

(54) ELECTRONIC DEVICE, METHOD, AND COMPUTER READABLE MEDIUM HAVING INSTRUCTIONS CAPABLE OF AUTOMATICALLY MEASURING PARAMETER(S) ASSOCIATED WITH BATTERY CELL

(71) Applicant: MEDIATEK INC., Hsin-Chu (TW)

(72) Inventors: Jui-Chi Wu, Taichung (TW); Chi-Ming Lee, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 682 days.

This patent is subject to a terminal disclaimer.

(21) Appl. No.: 14/597,205

(22) Filed: Jan. 14, 2015

(65) Prior Publication Data
US 2015/0241518 A1  Aug. 27, 2015

Related U.S. Application Data

(60) Provisional application No. 61/942,807, filed on Feb. 21, 2014.

(51) Int. Cl.
*G01R 31/36* (2006.01)

(52) U.S. Cl.
CPC ..... *G01R 31/3662* (2013.01); *G01R 31/3624* (2013.01); *G01R 31/3627* (2013.01)

(58) Field of Classification Search
CPC ............ G01R 31/3662; G01R 31/3624; G01R 31/3627
See application file for complete search history.

(56) References Cited

U.S. PATENT DOCUMENTS

| 9,864,015 | B2 | 1/2018 | Wu |
| 2002/0093311 | A1 | 7/2002 | Stryker |
| 2008/0200220 | A1 | 8/2008 | Jackson |
| 2008/0201587 | A1 | 8/2008 | Lee |
| 2009/0187780 | A1 | 7/2009 | Keohane |
| 2012/0210150 | A1 | 8/2012 | de Lind Van Wijngaarden |
| 2012/0239949 | A1 | 9/2012 | Kalyanasundaram |
| 2013/0254579 | A1 | 9/2013 | Derbyshire |
| 2013/0320880 | A1 | 12/2013 | Walker |
| 2016/0299551 | A1 | 10/2016 | Wu |

FOREIGN PATENT DOCUMENTS

| CN | 101339214 A | 1/2009 |
| CN | 101349713 A | 1/2009 |
| CN | 101611364 A | 12/2009 |
| CN | 101943942 A | 1/2011 |

(Continued)

OTHER PUBLICATIONS

"International Search Report" dated Mar. 3, 2015 for International application No. PCT/CN2014/092475, International filing date Nov. 28, 2014.

*Primary Examiner* — Kyoung Lee
(74) *Attorney, Agent, or Firm* — Winston Hsu

(57) ABSTRACT

A method applied into an electronic device and capable of automatically measuring at least one parameter includes: launching an automatic program/application on the electronic device; and using the automatic program/application to measure the at least one parameter that is at least associated with a battery cell connected to and used for providing power to the electronic device.

18 Claims, 4 Drawing Sheets

(56) References Cited

FOREIGN PATENT DOCUMENTS

| | | |
|---|---|---|
| CN | 102612655 A | 7/2012 |
| CN | 202383263 U | 8/2012 |
| CN | 102854471 A | 1/2013 |
| CN | 103198543 A | 7/2013 |
| CN | 103199310 A | 7/2013 |
| CN | 203178367 U | 9/2013 |
| CN | 103370969 A | 10/2013 |
| CN | 104977539 A | 10/2015 |
| CN | 105004928 A | 10/2015 |
| EP | 2 403 183 A1 | 1/2012 |
| JP | 2002-304239 A | 10/2002 |
| JP | 2003-202935 A | 7/2003 |
| JP | 2003-295986 A | 10/2003 |
| JP | 2006-331107 A | 12/2006 |
| JP | 2009-545816 A | 12/2009 |
| JP | 2010-507869 A | 3/2010 |
| JP | 2013-138455 A | 7/2013 |
| KR | 1020040103991 A | 12/2004 |
| KR | 10-2011-0006266 A | 1/2011 |
| WO | 2012/109048 A1 | 8/2012 |

ELECTRONIC DEVICE, METHOD, AND COMPUTER READABLE MEDIUM HAVING INSTRUCTIONS CAPABLE OF AUTOMATICALLY MEASURING PARAMETER(S) ASSOCIATED WITH BATTERY CELL

CROSS REFERENCE TO RELATED APPLICATIONS

This application claims the benefit of U.S. Provisional Application No. 61/942,807, which was filed on Feb. 21, 2014.

BACKGROUND

The invention relates to a scheme for measuring parameter(s) of a battery, and more particularly to a method capable of automatically measuring parameter(s) of a battery cell.

Generally speaking, parameter(s) of a battery may be measured manually before the battery goes out. In a conventional scheme, it is almost necessary for a user to employ an external measuring equipment device to manually and respectively measure the parameter (s) of the battery. For example, the user may manually employ a conventional measuring equipment device to externally measure an alternating current (AC) resistance of a battery. In addition, in another case, the user may manually employ another conventional measuring equipment device to externally measure a direct current (DC) resistance of the battery.

However, after the battery has gone out, parameter(s) of the battery may change with times due to temperature variations or environmental conditions. It is required to measure the parameter(s) again. However, practically, it is difficult for the user to manually employ a conventional measuring equipment device to externally measure AC resistance or DC resistance of the battery. Accordingly, it is important to provide a novel scheme capable of measuring the parameter(s) of a battery once the parameter(s) may change with times.

SUMMARY

Therefore one of the objectives of the invention is to provide a scheme capable of automatically measuring parameter(s), to solve the above-mentioned problems.

According to an embodiment of the invention, a method applied into an electronic device and capable of automatically measuring at least one parameter is disclosed. The method comprises: launching an automatic program/application on the electronic device; and using the automatic program/application to measure the at least one parameter that is at least associated with a battery cell connected to and used for providing power to the electronic device.

According to an embodiment of the invention, an electronic device capable of automatically measuring at least one parameter is disclosed. The electronic device comprises a software module and a processing circuit. The software module is used for launching an automatic program/application on the electronic device. The processing circuit is used for using the automatic program/application to measure the at least one parameter that is at least associated with a battery cell connected to and used for providing power to the electronic device.

According to an embodiment of the invention, a computer readable medium comprising multiple instructions upon executing these instructions stored in a computer readable device is disclosed. These instructions perform the following steps: launching an automatic program/application on the electronic device; and using the automatic program/application to measure the at least one parameter that is at least associated with a battery cell connected to and used for providing power to the electronic device.

According to the above-mentioned embodiments, by automatically measuring parameter(s) associated with a battery cell, it is not required for a user to employ an external measuring equipment device to manually measure the parameter(s), and this also improves system performance.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
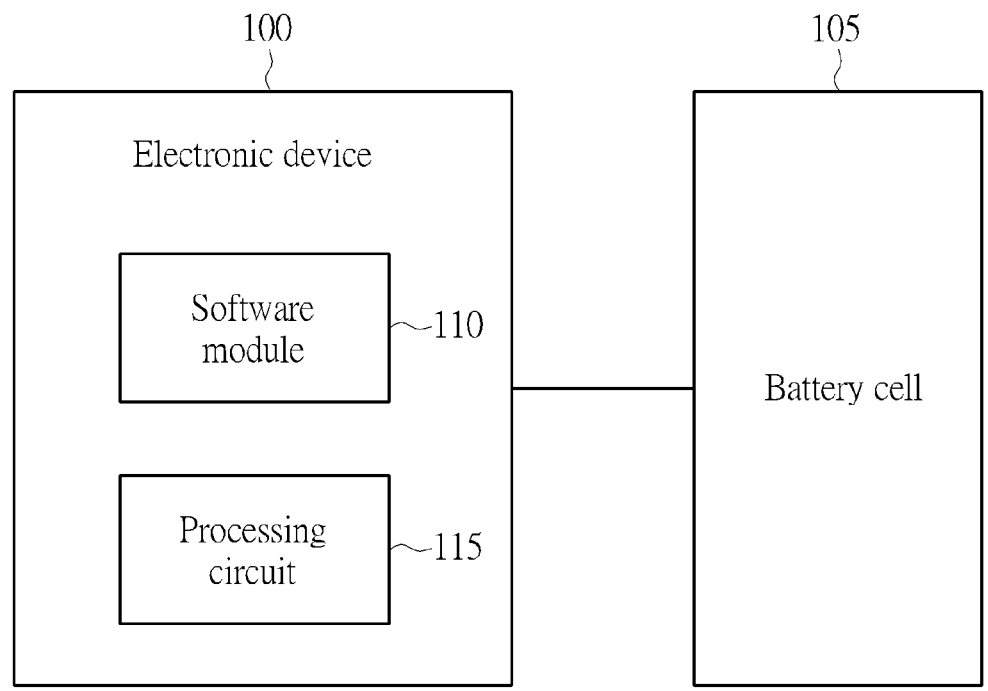
FIG. 1A is a block diagram of an electronic device capable of automatically measuring at least one parameter/information for a battery cell according to an embodiment of the invention.

Please refer to FIG. 1A, which is a block diagram of an electronic device 100 capable of automatically measuring at least one parameter (or information) corresponding to a battery cell 105 according to an embodiment of the invention. The electronic device 100 comprises a software module 110 and a processing circuit 115. The software module 110 is used for launching and executing an automatic program/application on the electronic device 100. The processing circuit 115 is arranged for using the software module 110 to trigger and execute the automatic program/application on the electronic device 100. The processing circuit 115 is arranged to use the automatic program/application of software module 110 to measure the at least one parameter that is at least associated with the battery cell 105 which is connected to and used for providing power to the electronic device 100. That is, the processing circuit 115 is used with the automatic program/application to measure the at least one parameter. The electronic device 100 for example is one of a mobile device, a mobile phone, a personal digital assistant (PDA) device, a laptop, and a personal computer, etc. In addition, the battery cell 105 can be implemented by using a variety of batteries. For example, the battery cell 105 may be a rechargeable (secondary) battery cell or a non-rechargeable battery cell. All the above-mentioned examples fall within the scope of the invention.

The above-mentioned parameter(s) is/are associated with battery power and in this embodiment may comprise an alternating current (AC) resistance, a direct current (DC) resistance, an internal voltage level, and/or a battery capacity. The processing circuit 115 is arranged to use the automatic program/application of software module 110 to measure the AC resistance, DC resistance, internal voltage level, and/or the battery capacity. The AC resistance and DC resistance may be associated with the battery cell 105 and a trace connected between the battery cell 105 and electronic device 100. By measuring the AC resistance, DC resistance, internal voltage level, and/or battery capacity, the processing circuit 115 can derive or calculate a maximum current threshold level that can be immediately consumed by the system operating on the electronic device 100. The processing circuit 115 can derive or calculate a maximum current threshold level that can be averagely consumed by the system. The processing circuit 115 can also derive or calculate a minimum system voltage level that is provided for the system. By deriving or calculating the immediately maximum current threshold level, averagely maximum current threshold level, or the minimum system voltage level, the system operating on the electronic device 100 can perform power throttling operations and/or can calculate power budget according to the immediately maximum current level, averagely maximum current level, or the minimum system voltage level, so as to extend the lifetime of battery cell 105 or improve/optimize the system performance.

By using the automatic program/application running on the electronic device to automatically measure at least one parameter/information for the battery cell 105, it is not required and necessary for a user to employ an external measuring equipment device to measure the parameter/information. That is, the external measuring equipment device of a conventional scheme can be replaced by the automatic program/application of this embodiment. In addition, the automatic program/application can obtain the parameter such as AC resistance, DC resistance, and/or battery capacity, the processing circuit 115 used with the software module 110 is capable of detecting and estimating an impedance of trace between the electronic device 100 and battery cell 105, the immediately maximum current level, averagely maximum current level, or the minimum system voltage level, and can provide these information for the system operating on the electronic device 100. Further, the processing circuit 115 used with the software module 110 can notify the system of whether the battery cell 105 cannot be used or. For the user, this scheme also simplifies the user's operation, and accordingly the error rate can be effectively reduced.

Figure 1B:
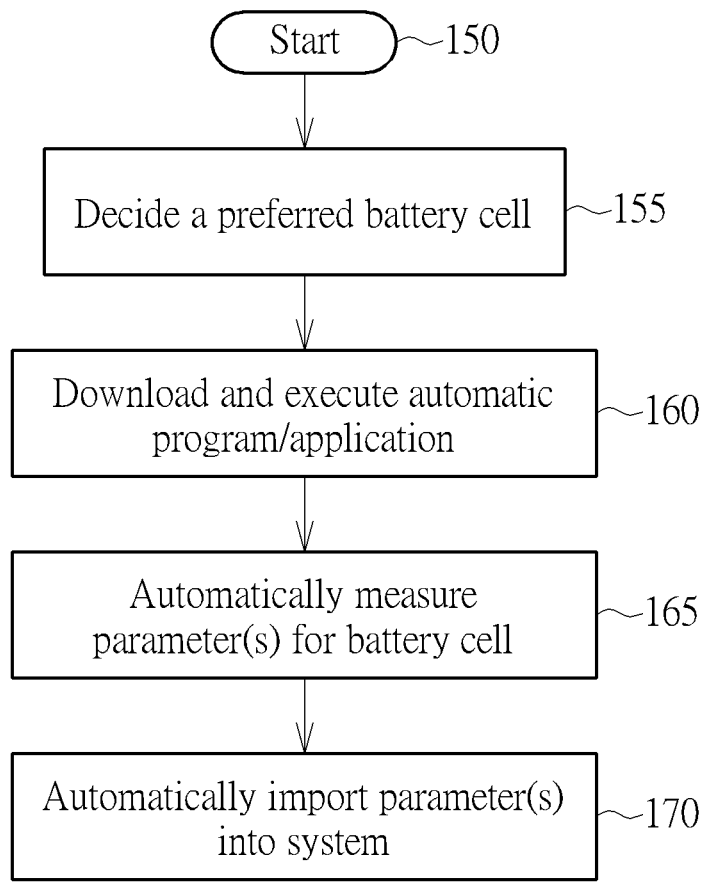
FIG. 1B is a flowchart of an example when the user uses the automatic program/application to measure the at least one parameter according to the embodiment of FIG. 1A.

FIG. 1B is a flowchart of an example when the user uses the automatic program/application to measure the at least one parameter according to the embodiment of FIG. 1A. Provided that substantially the same result is achieved, the steps of the flowchart shown in FIG. 1B need not be in the exact order shown and need not be contiguous, that is, other steps can be intermediate. The description of steps is detailed in the following:

Step 150: Start;

Step 155: The user decides and uses a preferred battery cell;

Step 160: The user downloads and executes the automatic program/application;

Step 165: The automatic program/application automatically measures parameter(s) for the battery cell 105; and Step 170: The automatic program/application automatically imports the parameter(s) into the system running on the electronic device 100.

As mentioned above, in Step 165 and Step 170, the automatic program/application is capable of supporting functions of automatically measures parameter(s) and importing the parameter(s) into the system. It is not required for the user to manually measure and import the parameter(s).

Figure 2:
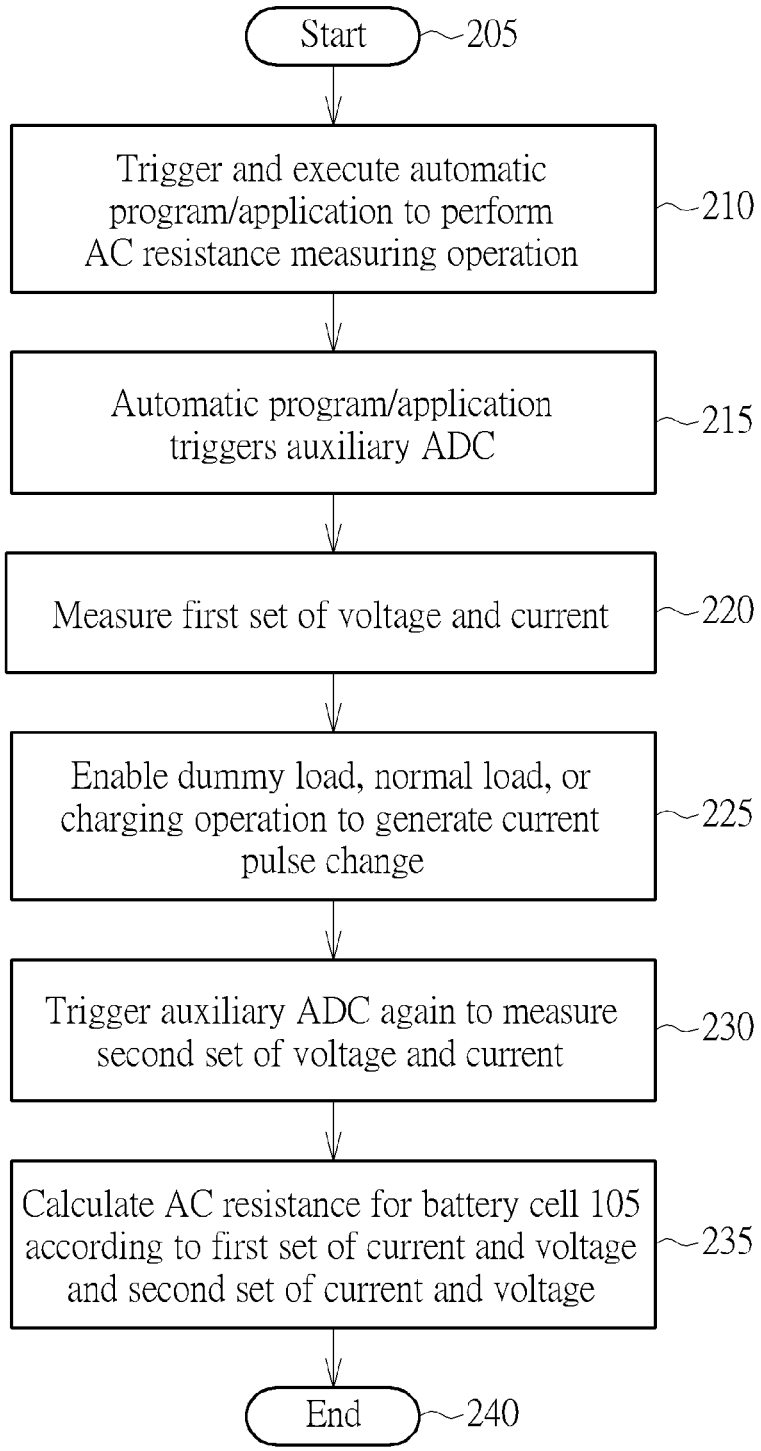
FIG. 2 is a diagram illustrating a flowchart of AC resistance measuring operation of the electronic device as shown in FIG. 1A.

Please refer to FIG. 2, which is a diagram illustrating a flowchart of AC resistance measuring operation of the electronic device 100 as shown in FIG. 1A. Provided that substantially the same result is achieved, the steps of the flowchart shown in FIG. 2 need not be in the exact order shown and need not be contiguous, that is, other steps can be intermediate. The description of AC resistance measuring operation is described in the following:

Step 205: Start;

Step 210: The processing circuit 115 launches the software module to trigger and execute the automatic program/application, so as to perform AC resistance measuring operation;

Step 215: The automatic program/application triggers an auxiliary analog-to-digital converter (ADC);

Step 220: The processing circuit 115 uses the auxiliary ADC to measure a first set of voltage and current for the battery cell 105;

Step 225: The automatic program/application enables at least one of a dummy load, a normal load, and a charging operation, and the processing circuit 115 generates a current pulse change on the battery cell 105;

Step 230: The automatic program/application triggers the auxiliary ADC again, and the processing circuit 115 uses the auxiliary ADC to measure a second set of voltage and current for the battery cell 105;

Step 235: The processing circuit 115 calculates the AC resistance for the battery cell 105 according to the first set of current and voltage and the second set of current and voltage; and Step 240: End.

As shown in FIG. 2, in Step 225, by enabling the dummy load and/or normal load, the processing circuit 115 can instantly generate the current pulse change for the system operating on the electronic device 100 by discharging the battery cell 105 with a specific current. In another example, by enabling the charging operation for the battery cell 105, the processing circuit 115 can instantly generate the current pulse change for the system operating on the electronic device 100 by charging the battery cell 105 with another specific current. That is, the processing circuit 115 can create current variation by using the dummy load, normal load (normal system task power consumption), and/or by adjusting a charger current. In addition, when enabling the charging operation for the battery cell 105, the processing circuit 115 may be used with a charging circuit (not shown in FIG. 1A) and/or other application circuit(s) to generate the current pulse change so as to measure the AC resistance.

In Step 235, based on the first set of voltage and current and second set of voltage and current, the processing circuit 115 can derive/calculate or measure the AC resistance for the battery cell 105. In accordance with the measured AC resistance, the processing circuit 115 can derive or calculate the averagely maximum current level, the immediately maximum current level, and/or the minimum system voltage level mentioned above. In addition, the auxiliary ADC mentioned above may be implemented by using an ADC which is capable of performing voltage measuring operation and/or current measuring operation.

Figure 3:
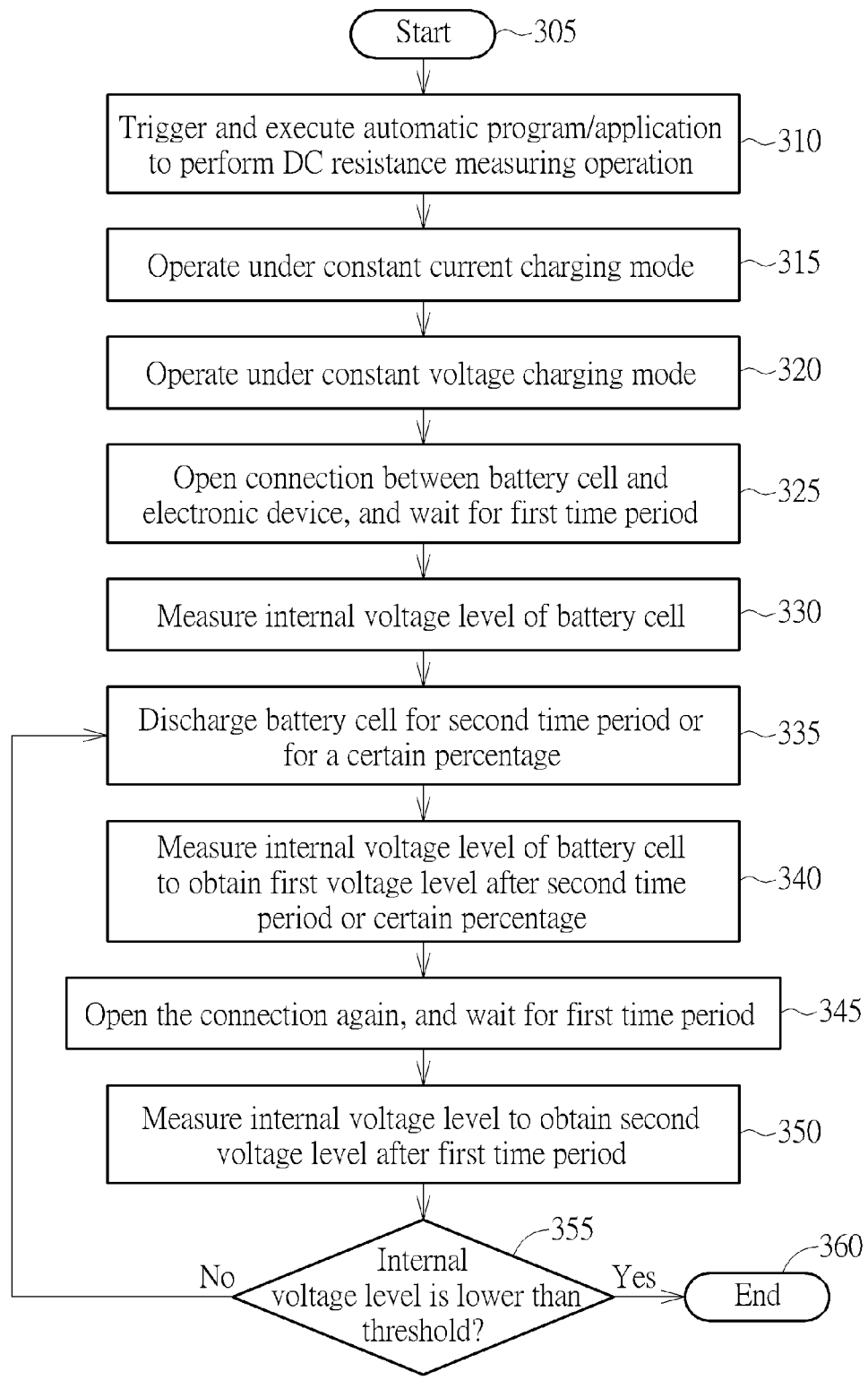
FIG. 3 is a diagram illustrating a flowchart of DC resistance measuring operation of the electronic device as shown in FIG. 1A.

Please refer to FIG. 3, which is a diagram illustrating a flowchart of DC resistance measuring operation of the electronic device 100 as shown in FIG. 1A. Provided that substantially the same result is achieved, the steps of the flowchart shown in FIG. 3 need not be in the exact order shown and need not be contiguous, that is, other steps can be intermediate. The description of DC resistance measuring operation is described in the following:

Step 305: Start;

Step 310: The processing circuit 115 launches the software module to trigger and execute the automatic program/application, so as to perform the DC resistance measuring operation;

Step 315: The electronic device 100 operates under a constant current charging mode, and the battery cell 105 is charged by a constant charging current;

Step 320: The electronic device 100 operates under a constant voltage charging mode, and the battery cell 105 is charged by a variable charging current;

Step 325: The electronic device 100 opens the connection between the battery cell 105 and electronic device 100 so that the current passing through the battery cell 105 becomes zero, and waits for a first time period;

Step 330: The electronic device 100 estimates or measures the internal voltage level VBAT of battery cell 105 to obtain the internal voltage level VBAT;

Step 335: The electronic device 100 discharges the battery cell 105 by using a specific current for a second time period or for a certain percentage;

Step 340: The electronic device 100 estimates or measures the internal voltage level VBAT of battery cell 105 to obtain a first voltage level after the second time period or the certain percentage;

Step 345: The electronic device 100 opens the connection between the battery cell 105 and electronic device 100 so that the current passing through the battery cell 105 becomes zero, and waits for the first time period;

Step 350: The electronic device 100 estimates or measures the internal voltage level VBAT of battery cell 105 to obtain a second voltage level after the first time period;

Step 355: The electronic device 100 detects whether the internal voltage level of the battery cell 105 is lower than a threshold. If the internal voltage level is lower than the threshold, then the flow proceeds to Step 360; otherwise, the flow proceeds to Step 335; and Step 360: End.

After measuring the first voltage level and the second voltage level, the processing circuit 115 can estimate the DC resistance for the battery cell and the trace between the battery cell 105 and electronic device 100 according to the first voltage level, the second voltage level, and the specific current that is used for discharging the battery cell 105. It should be noted that the measured second voltage level is substantially equal to the internal voltage level VBAT of battery cell 105. However, this is not intended to be a limitation of the invention.

Additionally, based on the above-mentioned method, an embodiment of the present invention relates to a computer storage product with a computer readable medium having computer code thereon for performing various computer-implemented operations. The computer readable medium comprises multiple instructions upon executing these instructions stored in a computer readable device. The instructions perform the following steps: launching an automatic program/application on the electronic device; and using the automatic program/application to measure the at least one parameter that is at least associated with a battery cell connected to and used for providing power to the electronic device. In addition, the instructions can perform the steps of FIG. 2 and FIG. 3. The description of the steps is not detailed for brevity. For example, examples of the computer readable device may include (but are not limited) magnetic media such as hard disks, optical media such as CD-ROMs and holographic devices, magneto-optical media such as optical disks, and hardware devices that are specially configured to store and execute program code, such as application-specific integrated circuits ("ASICs"), programmable logic devices ("PLDs") and ROM and RAM devices. Examples of the instructions include machine code and files containing higher-level code that are executed by a computer using an interpreter. For example, an embodiment of the invention may be implemented using Java, C++, or other object-oriented programming language. Another embodiment of the invention may be implemented in hardwired circuitry in place of, or in combination with, software instructions.

Furthermore, the processing circuit 115 can execute the automatic program/application to measure the parameter(s) once one percent change occurs on the battery percentage. If the battery percentage is not considered, then the automatic program/application can be used to continually measure the parameter(s). Alternatively, the automatic program/application can be used to periodically measure the parameter(s). These examples are not meant to be limitations of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method applied into an electronic device and capable of automatically measuring at least one parameter, comprising:

launching an automatic program/application on the electronic device;

using the automatic program/application to measure the at least one parameter that is at least associated with the battery cell connected to and used for providing power to the electronic device; and performing power throttling of the electronic device to determine a power budget based on the at least one parameter that is at least associated with the battery cell.

2. The method of claim 1, wherein the step of using the automatic program/application to measure the at least one parameter comprises:

using the automatic program/application to measure at least one of an alternating current (AC) resistance, a direct current (DC) resistance, an internal voltage level, and a battery capacity those are at least associated with the battery cell.

3. The method of claim 2, wherein the AC resistance and the DC resistance are further associated with a trace connected between the battery cell and the electronic device.

4. The method of claim 1, wherein the electronic device is one of a mobile device, a mobile phone, a personal digital assistant (PDA) device, a laptop, and a personal computer.

5. The method of claim 1, wherein the at least one parameter comprises an AC resistance, and the step of using the automatic program/application to measure the at least one parameter comprises:

measuring a first set of voltage and current for the battery cell;

generating a current pulse change on the battery cell; and measuring a second set of voltage and current for the battery cell after the current pulse change has been generated; and calculating the AC resistance for the battery cell according to the first set of current and voltage and the second set of current and voltage.

6. The method of claim 5, wherein the step of generating the current pulse change on the battery cell comprises:
enabling at least one of a dummy load, a normal load, and a charging operation to generate the current pulse change.

7. The method of claim 1, wherein the at least one parameter comprises a DC resistance, and the step of using the automatic program/application to measure the at least one parameter comprises:
discharging the battery cell by a specific discharging current for a second time period;
measuring a first voltage level for the battery cell after the second time period;
waiting for a first time period after the second time period; and
measuring a second voltage level for the battery cell after the first time period;
deriving a DC resistance for the battery cell according to the first voltage level, the specific discharging current, and the second voltage level.

8. An electronic device capable of automatically measuring at least one parameter, comprising:
a software module, for launching an automatic program/application on the electronic device; and
a processing circuit, for using the automatic program/application to measure the at least one parameter that is at least associated with a battery cell connected to and used for providing power to the electronic device, and for performing power throttling of the electronic device to determine a power budget based on the at least one parameter that is at least associated with the battery cell.

9. The electronic device of claim 8, wherein the processing circuit is arranged to use the automatic program/application to measure at least one of an alternating current (AC) resistance, a direct current (DC) resistance, an internal voltage level, and a battery capacity that are at least associated with the battery cell.

10. The electronic device of claim 9, wherein the AC resistance and the DC resistance are further associated with a trace connected between the battery cell and the electronic device.

11. The electronic device of claim 8, wherein the electronic device is one of a mobile device, a mobile phone, a personal digital assistant (PDA) device, a laptop, and a personal computer.

12. The electronic device of claim 8, wherein the at least one parameter comprises an AC resistance, and the processing circuit is arranged for:
measuring a first set of voltage and current for the battery cell;
generating a current pulse change on the battery cell; and
measuring a second set of voltage and current for the battery cell after the current pulse change has been generated; and
calculating the AC resistance for the battery cell according to the first set of current and voltage and the second set of current and voltage.

13. The electronic device of claim 12, wherein the processing circuit is arranged for enabling at least one of a dummy load, a normal load, and a charging operation to generate the current pulse change.

14. The electronic device of claim 8, wherein the at least one parameter comprises a DC resistance, and the processing circuit is arranged for:
discharging the battery cell by a specific discharging current for a second time period;
measuring a first voltage level for the battery cell after the second time period;
waiting for a first time period after the second time period; and
measuring a second voltage level for the battery cell after the first time period;
deriving a DC resistance for the battery cell according to the first voltage level, the specific discharging current, and the second voltage level.

15. A non-transitory computer readable medium comprising multiple instructions upon executing these instructions stored in a computer readable device, upon executing these instructions, a computer performing the following steps:
launching an automatic program/application on the electronic device;
using the automatic program/application to measure the at least one parameter that is at least associated with a battery cell connected to and used for providing power to the electronic device; and
performing power throttling of the electronic device to determine a power budget based on the at least one parameter that is at least associated with the battery cell.

16. The non-transitory computer readable medium of claim 15, wherein the at least one parameter comprises an AC resistance, and the step of using the automatic program/application to measure the at least one parameter comprises:
measuring a first set of voltage and current for the battery cell;
generating a current pulse change on the battery cell; and
measuring a second set of voltage and current for the battery cell after the current pulse change has been generated; and
calculating the AC resistance for the battery cell according to the first set of current and voltage and the second set of current and voltage.

17. The non-transitory computer readable medium of claim 16, wherein the step of generating the current pulse change on the battery cell comprises:
enabling at least one of a dummy load, a normal load, and a charging operation to generate the current pulse change.

18. The non-transitory computer readable medium of claim 15, wherein the at least one parameter comprises a DC resistance, and the step of using the automatic program/application to measure the at least one parameter comprises:
discharging the battery cell by a specific discharging current for a second time period;
measuring a first voltage level for the battery cell after the second time period;
waiting for a first time period after the second time period; and
measuring a second voltage level for the battery cell after the first time period;
deriving a DC resistance for the battery cell according to the first voltage level, the specific discharging current, and the second voltage level.

* * * * *